(12) United States Patent (10) Patent No.: US 9,047,977 B2
Chen (45) Date of Patent: Jun. 2, 2015

(54) CIRCUIT AND METHOD FOR OUTPUTTING REFRESH EXECUTION SIGNAL IN MEMORY DEVICE

(75) Inventor: Chung Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 181 days.

(21) Appl. No.: 13/105,673

(22) Filed: May 11, 2011

(65) Prior Publication Data

US 2012/0287742 A1 Nov. 15, 2012

(51) Int. Cl.
*G11C 11/406* (2006.01)
(52) U.S. Cl.
CPC ........ *G11C 11/406* (2013.01); *G11C 11/40611* (2013.01)
(58) Field of Classification Search
USPC ........................................................ 365/222
See application file for complete search history.

(56) References Cited

U.S. PATENT DOCUMENTS

| 5,495,452 A  * | 2/1996  | Cha    | 365/222 |
| 7,286,377 B1 * | 10/2007 | Pyeon  | 365/22  |
| 7,489,580 B2 * | 2/2009  | Ito et al. | 365/222 |
| 8,300,488 B2 * | 10/2012 | Pyeon  | 365/222 |

* cited by examiner

*Primary Examiner* — Vanthu Nguyen
(74) *Attorney, Agent, or Firm* — Juan Carlos A. Marquez; Bacon & Thomas PLLC

(57) ABSTRACT

A circuit for outputting a refresh execution signal to a memory cell of a memory device in an auto-refresh mode comprises a first frequency dividing unit, a first selection circuit, a second frequency dividing unit, and a second selection circuit. The first frequency dividing unit receives an auto-refresh signal from outside the memory device and generates a plurality of first divided signals. The first selection circuit generates a selection signal selected from the auto-refresh signal and the first divided signals. The second frequency dividing unit divides the frequency of the selection signal and generates a plurality of second divided signals. The second selection circuit generates the refresh execution signal from the selection signal and the second divided signals.

15 Claims, 3 Drawing Sheets

CIRCUIT AND METHOD FOR OUTPUTTING REFRESH EXECUTION SIGNAL IN MEMORY DEVICE

BACKGROUND OF THE INVENTION

1. Field of the Invention

The present invention relates generally to a circuit and a method for outputting a refresh execution signal to a memory cell of a memory device in an auto-refresh mode.

2. Description of the Related Art

Semiconductor memory devices are devices in which data can be stored and from which stored data can be retrieved. Semiconductor memory devices can be classified into random access memory (RAM) and read only memory (ROM). RAM is a volatile memory that needs power supply to retain data, while ROM is a nonvolatile memory that can retain data even when power is not supplied.

A well-known example of RAM is a dynamic RAM (DRAM). A DRAM memory device often comprises a large number of memory cells, each of which is constructed of one transistor and one capacitor. A DRAM memory device achieves storage of data by storing charges in capacitors. Because a charge stored in a capacitor slowly leaks over time, the memory cells of the DRAM memory device need to be periodically refreshed or updated to a full value.

Several schemes have been developed to systematically refresh memory cells in a DRAM memory device, one of which is an auto-refresh scheme. The auto-refresh is a mode in which a memory cell corresponding to an address generated by an internal address counter performs a refresh operation in a fixed period when an auto-refresh command is input. After the refresh operation, the address counter is re-initialized and is provided for the next auto-refresh command.

In the auto-refresh operation, the refresh cycle is controlled by the command from outside. In response to the command, the memory device performs an auto-refresh operation. Therefore, the period of time that it takes to refresh all of the memory cells in the memory device cannot be adjusted. Since the DRAM memory device generally consumes a relatively large amount of power when the memory cells of the DRAM are being refreshed, it is desired to provide a method and a circuit for outputting a refresh execution signal according to different conditions so as to reduce current consumption of the memory device.

SUMMARY OF THE INVENTION

An aspect of the present invention is to provide a circuit for outputting a refresh execution signal to a memory cell of a memory device in an auto-refresh mode.

According to one embodiment of the present invention, the circuit comprises a first frequency dividing unit, a first selection circuit, a second frequency dividing unit, and a second selection circuit. The first frequency dividing unit receives an auto-refresh signal from outside the memory device and generates a plurality of first divided signals. The first selection circuit generates a selection signal selected from the auto-refresh signal and the first divided signals. The second frequency dividing unit divides the frequency of the selection signal and generates a plurality of second divided signals. The second selection circuit generates the refresh execution signal from the selection signal and the second divided signals.

Another aspect of the present invention is to provide a method for outputting a refresh execution signal to a memory cell of a memory device in an auto-refresh mode.

According to one embodiment of the present invention, the method comprises receiving an auto-refresh execution signal from outside the memory device, dividing the frequency of the auto-refresh signal for generating a plurality of first divided signals, selecting one of the first divided signals as a selection signal, dividing the frequency of the selection signal for generating a plurality of second divided signals, and selecting one of the second divided signals as the refresh execution signal.

BRIEF DESCRIPTION OF THE DRAWINGS

The invention will be described according to the appended drawings in which.

DETAILED DESCRIPTION OF THE INVENTION

Figure 1:
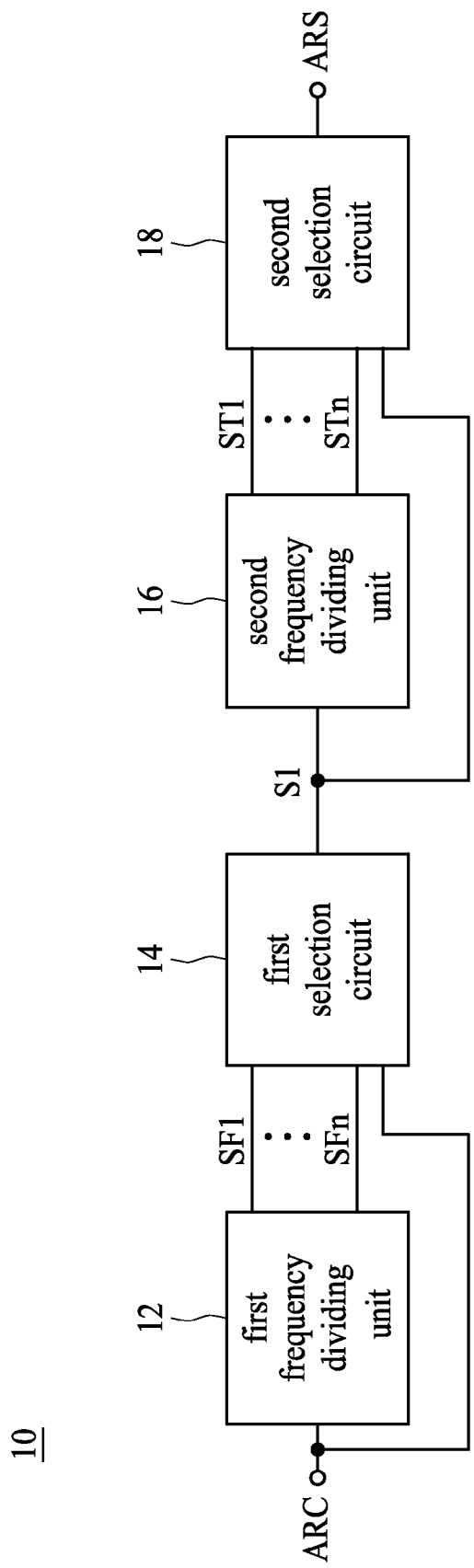
FIG. 1 is a functional block diagram illustrating a configuration of a circuit serving to output a refresh signal according to one embodiment of the present invention.

FIG. 1 is a functional block diagram illustrating a configuration of a circuit 10 serving to output a refresh signal to a memory cell of a memory device in an auto-refresh mode according to one embodiment of the present invention. Referring to FIG. 1, the circuit 10 of the present invention comprises a first frequency dividing unit 12, a first selection circuit 14, a second frequency dividing unit 16, and a second selection circuit 18.

Referring to FIG. 1, the first frequency dividing unit 12 receives an auto-refresh signal ARC from outside of the memory device to generate a plurality of first divided signals SF1-SFn. The first selection circuit 14 generates a selection signal S1 from the auto-refresh signal ARC and the first divided signals SF1-SFn. The second frequency dividing unit 16 divides the frequency of the selection signal S1 to generate a plurality of second divided signals ST1-STn. The second selection circuit 18 generates the refresh execution signal ARS from the selection signal S1 and the second divided signals ST1-STn.

Figure 2:
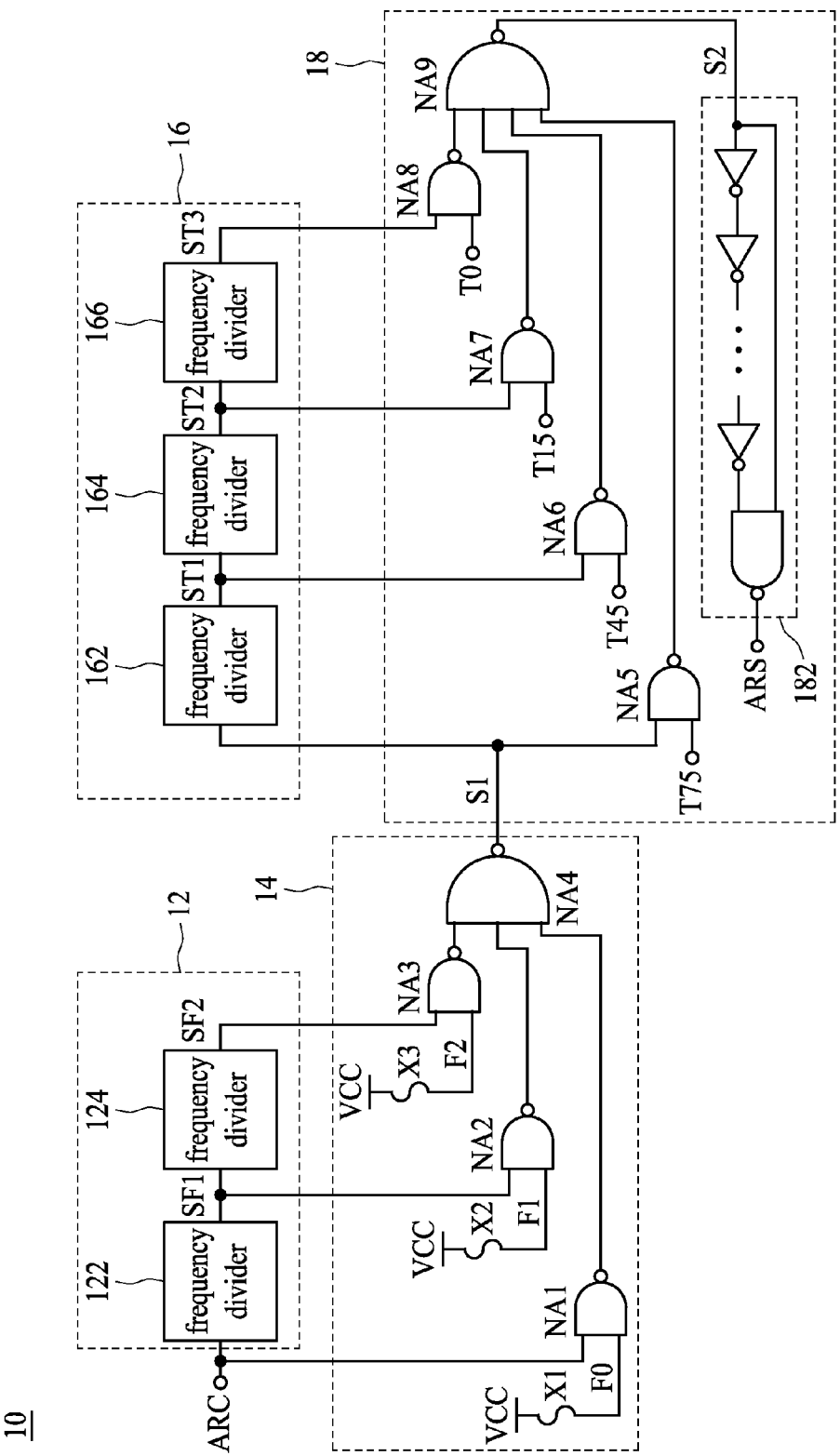
FIG. 2 illustrates a detailed circuit diagram of the circuit according to one embodiment of the present invention.

FIG. 2 illustrates a detailed circuit diagram of the circuit 10 shown in FIG. 1 according to one embodiment of the present invention. Referring to FIG. 2, the first frequency dividing unit 12 generates two divided signals SF1-SF2, each having different divided values. In this embodiment, the first frequency dividing unit 12 comprises two frequency dividers 122 and 124 to perform a frequency-dividing operation. In one embodiment of the present invention, the frequency dividers 122 and 124 are implemented as a flip-flop counter.

Figure 3:
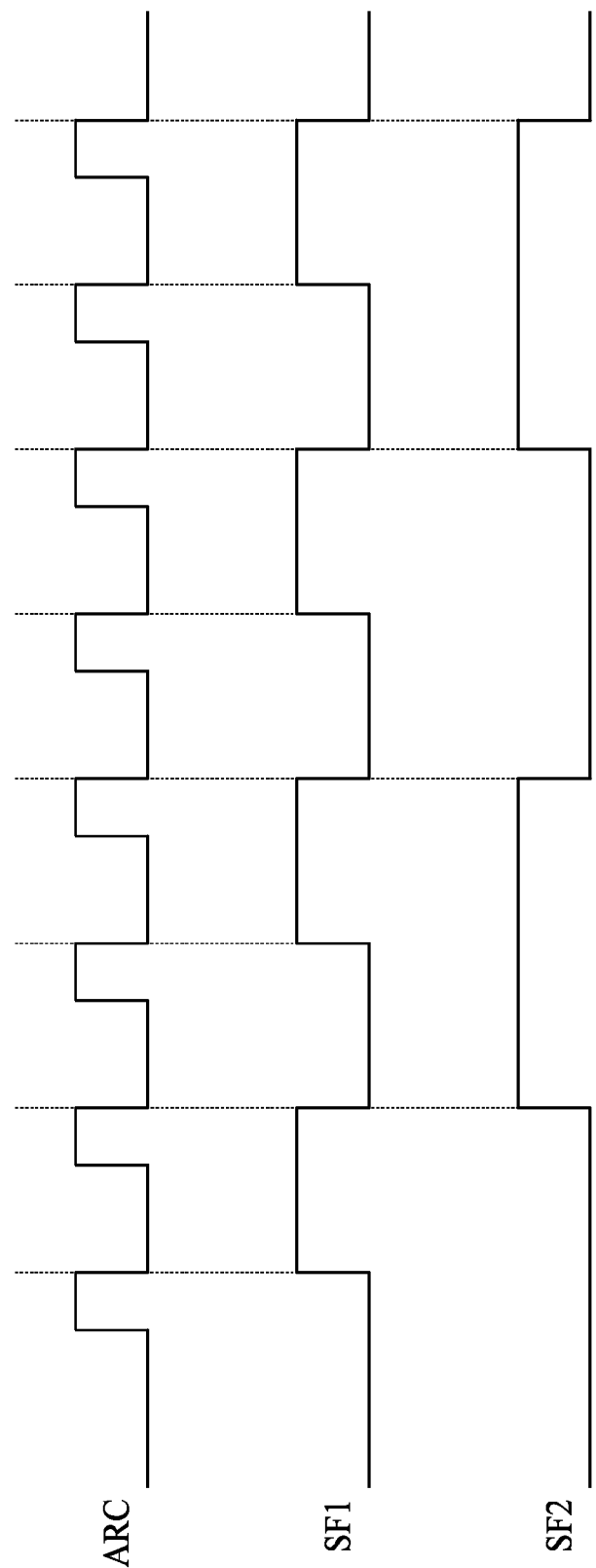
FIG. 3 shows the output waveform of the first frequency dividing unit.

FIG. 3 shows the output waveform of the first frequency dividing unit 12 in this embodiment. Referring to FIG. 3, signal SF1 has a frequency equal to one-half of the frequency of the auto-refresh signals ARC, and signal SF2 has a frequency equal to one-half of the frequency of the signal SF1.

The first selection circuit 14 generates the selection signal Si selected from the auto-refresh signals ARC and the first divided signals SF1-SF2. Referring to FIG. 2, the first selection circuit 14 comprises a plurality of two-input NAND gates NA1, NA2, and NA3. NAND gate NA1 receives input signals F0 and ARC, NAND gate NA2 receives input signals F1 and SF1, and NAND gate NA3 receives input signals F2 and SF2. The logic level of the input signals F0, F1, and F2 are determined by the status of the fuses X1, X2, and X3, respectively. For example, if the fuse X1 is melted, the signal F0 has a logic low level, and thus the output of the NAND gate NA1 remains at a logic high level regardless of the variation of the input signal ARC.

After the selection signal S1 is generated, the second frequency dividing unit 16 receives the signal S1 to generate a plurality of second divided signals ST1-ST3 as shown in FIG. 2. The second frequency dividing unit 16 is composed of three frequency dividers 162, 164, and 166 connected in series. The configuration of the frequency dividers 162, 164, and 166 is similar to that of the frequency dividers 122 and 124. Therefore, divided signals ST1, ST2, and ST3 each has a frequency equal to one-half of the frequency of the respective input signal.

The second selection circuit 18 generates a selection signal S2 selected from the signal S1 and the divided signals ST1, ST2, and ST3. Referring to FIG. 2, the second selection circuit 18 comprises a plurality of two-input NAND gates NA5, NA6, NA7, and NA8. NAND gate NA5 receives input signals S1 and T75, NAND gate NA6 receives input signals ST1 and T45, NAND gate NA7 receives input signals ST2 and T15, and NAND gate NA8 receives input signals ST3 and T0. Signals T75, T45, T15, and T0 are temperature signals depending upon a temperature variation. For example, if the temperature of the memory device is greater than 75 degrees, the signal T75 has a logic high level. If the temperature of the memory device is between 45 degrees and 75 degrees, the signal T45 has a logic high level. If the temperature of the memory device is between 15 degrees and 45 degrees, the signal T15 has a logic high level. Finally, if the temperature of the memory device is below 15 degrees, the signal T0 has a logic high level.

The operation of the circuit 10 is described as follows. When a refresh command ARC from outside the memory device is input to the circuit 10, the circuit 10 generates a refresh execution signal ARS which indicates execution of a refresh operation. According to the embodiment of the present invention, the circuit 10 generates the signal ARS according to the temperature and the technology of the memory device. The period of time required to refresh all of the memory cells in the memory device is selected to ensure that data is not lost from the memory cells and is defined in the specifications of the DRAM device. For example, a memory device that includes 4096 rows of memory cells may refresh each memory cell at least once every 64 milliseconds. Therefore, in order to refresh all of the rows of memory cells in this particular memory device, at least 4096 auto-refresh operations are performed every 64 milliseconds.

However, according to the improved technology of the memory device, the data retention time of the memory cells can be greater than 64 milliseconds. Therefore, in one embodiment of the present invention, the first selection circuit 14 generates the selection signal S1 according to different data retention time of the memory cell. For example, if the data retention time of the memory cells is greater than 128 milliseconds, the fuses X1 and X3 are melted, and the signal F1 has a logic high level. Therefore, the frequency of the selection signal S1 is equal to that of the signal SF1 and the frequency of the refresh execution signal ARS is equal to or less than that of the signal S1. If the data retention time of the memory cells is greater than 256 milliseconds, the fuses X1 and X2 are melted, and the signal F2 has a logic high level. Therefore, the frequency of the selection signal S1 is equal to that of the signal SF2 and the frequency of the refresh execution signal ARS is equal to or less than that of the signal S1. In this manner, the current consumption of the memory device can be reduced according to the lower refresh frequency.

A data retention time of a memory cell of the DRAM device has a temperature dependency. That is, the data retention time is greater at lower temperatures. Therefore, in one embodiment of the present invention, the second selection circuit 18 generates the refresh execution signal ARS according to different temperatures of the memory device. For example, if the temperature of the memory device 10 is greater than 75 degrees, the signal T75 has a logic high level. Therefore, the frequency of the signal S2 is equal to that of the signal S1. If the temperature of the memory device 10 is between 45 and 75 degrees, the signal T45 has a logic high level. Therefore, the frequency of the signal S2 is equal to that of the signal ST1. Referring to FIG. 2, a pulse generating circuit 182 serves to receive the selection signal S2 and generate the refresh execution signal ARS in a pulse form. In this manner, the current consumption of the memory device can be reduced according to the lower refresh frequency.

The above-described embodiments of the present invention are intended to be illustrative only. Numerous alternative embodiments may be devised by those skilled in the art without departing from the scope of the following claims.

What is claimed is:

1. A circuit for outputting a refresh execution signal to a memory cell of a memory device in an auto-refresh mode, the circuit comprising:
   a first frequency dividing unit for receiving an auto-refresh signal from outside of the memory device and generating a plurality of first divided signals;
   a first selection circuit for generating a selection signal selected from one of the auto-refresh signal and the first divided signals according to a data retention time of the memory cell;
   a second frequency dividing unit for dividing the frequency of the selection signal and generating a plurality of second divided signals; and
   a second selection circuit for generating the refresh execution signal from one of the selection signal and the second divided signals according to a temperature of the memory cell, wherein
   the first frequency dividing unit includes a first frequency divider configured to provide a first one of the first divided signals in response to the auto-refresh signal, and
   the first frequency dividing unit includes a second frequency divider configured to provide a second one of the first divided signals in response to the first one of the first divided signals.

2. A method for outputting a refresh execution signal to a memory cell of a memory device in an auto-refresh mode, the method comprising:
   receiving an auto-refresh signal from outside of the memory device;
   dividing the frequency of the auto-refresh signal for generating a plurality of first divided signals;
   selecting a selection signal from one of the auto-refresh signal and the first divided signals according to a data retention time of the memory cell of the memory device;
   dividing the frequency of the selection signal for generating a plurality of second divided signals; and
   selecting from one of the selection signal and the second divided signals as the refresh execution signal according to a temperature of the memory cell, wherein the step of selecting the selection signal comprises:
   providing a plurality of fuses each associated with a corresponding one of the auto-refresh signal and the first divided signals, and melting one of the fuses according to the data retention time of the memory cell.

3. The circuit of claim 1, wherein the first selection circuit includes a first NAND gate having an input to receive the auto-refresh signal, and another input to receive a power supply signal via a fuse.

4. The circuit of claim 1, wherein the first selection circuit includes a second NAND gate having an input to receive the first one of the first divided signals, and another input to receive a power supply signal via a fuse.

5. The circuit of claim 4, wherein the first selection circuit includes a NAND gate having an input to receive an output of the first NAND gate, and another input to receive an output of the second NAND gate.

6. The circuit of claim 1, wherein the first selection circuit includes a third NAND gate having an input to receive the second one of the first divided signals, and another input to receive a power supply signal via a fuse.

7. The circuit of claim 1, wherein each of the first and second frequency dividers includes a divide-by-2 circuit.

8. The circuit of claim 1, wherein the second frequency dividing unit includes a first frequency divider configured to provide a first one of the second divided signals in response to the selection signal.

9. The circuit of claim 8, wherein the second selection circuit includes a first NAND gate having an input to receive the selection signal, and another input to receive a first signal, the first signal being asserted with a high logic value in response to operation of the memory device in a first temperature range.

10. The circuit of claim 9, wherein the second selection circuit includes a second NAND gate having an input to receive the first one of the second divided signals, and another input to receive a second signal, the second signal being asserted with a high logic value in response to operation of the memory device in a second temperature range different from the first temperature range.

11. The circuit of claim 10, wherein the second selection circuit includes a NAND gate having an input to receive an output of the first NAND gate, and another input to receive an output of the second NAND gate.

12. The circuit of claim 8, wherein the second frequency dividing unit includes a second frequency divider configured to provide a second one of the second divided signals in response to the first one of the second divided signals.

13. The circuit of claim 12, wherein the first selection circuit includes a third NAND gate having an input to receive the second one of the second divided signals, and another input to receive a third signal, the third signal being asserted with a high logic value in response to operation of the memory device in a third temperature range different from the first and second temperature ranges.

14. The circuit of claim 12, wherein each of the first and second frequency dividers includes a divide-by-2 circuit.

15. The method of claim 2, wherein selecting the refresh execution signal comprises:
providing a plurality of signals each indicative of a temperature range of the memory cell and associated with a corresponding one of the selection signal and a plurality of second divided signals; and
selecting one of the signals according to the temperature of the memory cell.

* * * * *